(12) United States Patent
Chen

(10) Patent No.: US 6,404,266 B1
(45) Date of Patent: Jun. 11, 2002

(54) DIFFERENTIAL INPUT STAGE WITH BIAS CURRENT REDUCTION FOR LATCH-UP PREVENTION

(75) Inventor: Sean S. Chen, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/624,738

(22) Filed: Jul. 25, 2000

(51) Int. Cl.[7] .............................................. H03K 17/60
(52) U.S. Cl. ......................... 327/478; 327/53; 327/563
(58) Field of Search ................................ 327/478, 560, 327/563, 52, 53, 65, 66; 330/250, 252, 257, 259, 260, 261, 300

(56) References Cited

U.S. PATENT DOCUMENTS

| | | | | |
|---|---|---|---|---|
| 4,649,352 A | * | 3/1987 | Blauschild | 330/261 |
| 5,153,529 A | * | 10/1992 | Koda et al. | 330/295 |
| 5,418,491 A | * | 5/1995 | Bowers | 330/252 |
| 5,420,542 A | * | 5/1995 | Harvey | 330/292 |
| 5,422,600 A | * | 6/1995 | Petty et al. | 330/257 |
| 5,475,339 A | * | 12/1995 | Maida | 327/561 |
| 5,729,177 A | * | 3/1998 | Goutti | 330/257 |
| 5,734,296 A | * | 3/1998 | Dotson et al. | 330/253 |
| 5,734,297 A | * | 3/1998 | Huijsing et al. | 330/253 |
| 6,031,423 A | * | 2/2000 | Basu | 330/253 |
| 6,137,363 A | * | 10/2000 | Miki et al. | 330/255 |
| 6,218,900 B1 | * | 4/2001 | Nolan | 330/255 |
| 6,229,394 B1 | * | 5/2001 | Harvey | 330/252 |

* cited by examiner

*Primary Examiner*—Toan Tran
*Assistant Examiner*—Hai L. Nguyen
(74) *Attorney, Agent, or Firm*—Merchant & Gould, P.C.; Brett A. Hertzberg

(57) ABSTRACT

A differential input stage with full-rail sensing and reduced latch-up susceptibility includes an emitter-coupled pair, a current mirror, and several series resistors. For a NPN emitter-coupled pair, a series resistor is connected between the input node and the base of each transistor of the emitter-coupled pair, and a series resistor is connected between each load resistor and its corresponding current mirror transistor. The series resistors reduce current flowing into the PN junctions when power to the overall circuit is disabled but an input signal is present at the input terminals.

16 Claims, 3 Drawing Sheets

DIFFERENTIAL INPUT STAGE WITH BIAS CURRENT REDUCTION FOR LATCH-UP PREVENTION

BACKGROUND INFORMATION

A differential input stage in some circuit applications can be susceptible to latch-up when power is disabled to the overall circuit but input signals are applied to the differential input stage. For example, the differential input stage may be part of an operational amplifier in a battery-operated device that is turned off and being recharged. In this example, the differential input stage includes an emitter-coupled pair coupled to a current mirror formed from bipolar transistors of conductivity opposite that of the emitter-coupled pair. In particular, each collector of the emitter-coupled pair is connected to an emitter of a corresponding bipolar transistor of the current mirror. The bases of the emitter-coupled pair are connected to receive the differential input signal.

Thus, for example, if the emitter-coupled pair is implemented with NPN transistors, the collectors of the emitter-coupled pair are connected to emitters of corresponding PNP transistors of the current mirror. This configuration is typically used to achieve full VCC-rail sensing of the differential input signal. The path from the base to the collector of one of the NPN transistors of the emitter coupled pair, and on to the emitter and base of the corresponding PNP transistor form a PNPN structure (i.e., similar to a silicon controlled rectifier or SCR) susceptible to latch-up. This PNPN structure can become forward biased in certain conditions. For example, if the power is off but a voltage is present across the bases of the emitter-coupled pair (which can arise when a battery-operated device is turned off or is turn-off and being recharged), the PNPN structure becomes forward biased. As is well known, once a SCR is turned on (i.e., one of the PN junctions becomes forward biased) and conducting at least a threshold current, the SCR is latched into a conductive state and, in general, can only be turned off by reducing the current through the SCR using an external circuitry. Thus, if the current through the PNPN structure is large enough, the PNPN structure is turned on, thereby causing latch-up.

In some implementations, the current mirror includes load resistors formed in a P-type well in an N-type tub. Each load resistor is connected between a PNP current mirror transistor and the VCC bus. Thus, another PNPN structure can be formed from the base to the collector of one of the NPN transistors of the emitter-coupled pair, to the P-type well of the load transistor and on to the N-type tub. Accordingly, there is a need for a differential input stage that provides full-rail sensing and reduces both latch-up susceptibility and power dissipation.

SUMMARY

In accordance with aspects of the present invention, a differential input stage with full-rail sensing and reduced latch-up susceptibility is provided. In one aspect of the present invention, the differential input stage includes an emitter-coupled pair, a current mirror, and several series resistors. For a NPN emitter-coupled pair, a series resistor is connected between the input node and the base of each transistor of the emitter-coupled pair, and a series resistor is connected between each load resistor and its corresponding current mirror transistor. The series resistors reduce current flowing into the P interface (i.e., the bases of the emitter-coupled pair and into the emitters of the current mirror transistors) when power to the overall circuit is disabled but an input signal is present at the input terminals of the differential input stage. This reduced current in turn reduces latch-up susceptibility and, in addition, reduces power dissipation through the parasitic PNPN structures when the power to the overall circuit is disabled.

In accordance with another aspect of the present invention, each series resistor is implemented in a P-type well formed in a N-type tub. A reverse-biased diode is connected between the VCC bus and the N-type tub proximate to the P-type wells to keep the PN junction of the P-type wells reversed biased, thereby disabling the parasitic PNPN structures.

DETAILED DESCRIPTION

Figure 1:
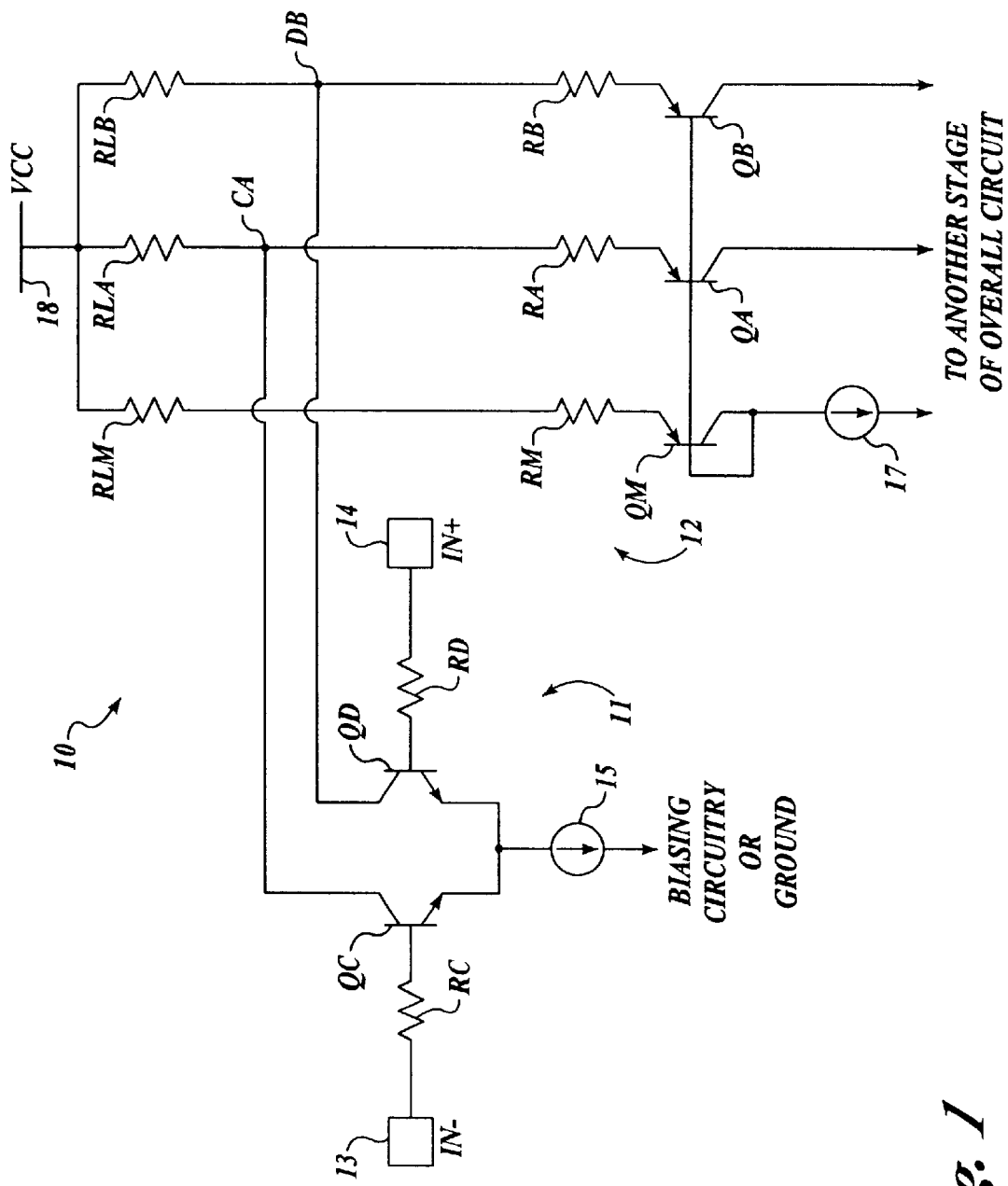
FIG. 1 is a schematic diagram illustrating a differential input stage, according to one embodiment of the present invention.

FIG. 1 schematically illustrates a differential input stage 10, according to one embodiment of the present invention. In this embodiment, differential input stage 10 includes an emitter-coupled pair stage 11 and a current mirror 12. Differential input stage 10 can be used as the input stage of an operational amplifier or other differential circuit applications that require full-rail input signal sensing.

Emitter-coupled pair stage 11 includes an inverting input terminal 13, a non-inverting input terminal 14, a current source 15, an emitter-coupled pair formed by NPN transistors QC and QD, and series resistors RC and RD.

In particular, series resistor RC is connected between inverting terminal 13 and the base of NPN transistor QC. Similarly, series resistor RD is connected between non-inverting terminal 14 and the base of NPN transistor QD. The coupled emitters of NPN transistors QC and QD are connected to current source 15, which provides the bias current of emitter-coupled pair stage 11. The collectors of NPN transistors QC and QD are respectively connected to a node CA and a node DB of current mirror 12.

Current mirror 12 includes a current source 17, PNP transistors QM, QA and QB, series resistors RM, RA and RB, and load resistors RLM, RLA and RLB. More specifically, current source 17 is connected to the collector of diode-connected PNP transistor QM, which sets the bias point of current mirror 12. Series resistor RM is connected between the emitter of PNP transistor QM and load resistor RLM, which is in turn connected between series resistor RM and a VCC bus 18. The base of PNP transistor QM is connected to the bases of PNP transistors QA and QB.

Series resistor RA is connected between the emitter of PNP transistor QA and the aforementioned node CA. Load resistor RLA in turn is connected between VCC bus 18 and node CA. Thus, the collector of NPN transistor QC is connected to resistors RA and RLA at node CA. Similarly, series resistor RB is connected between the emitter of PNP transistor QB and the aforementioned node DB. Load resistor RLB in turn is connected between node DB and VCC bus 18. Thus, the collector of NPN transistor QD is connected to resistors RB and RLB at node DB. The collectors of PNP transistors QA and QB are connected to a next stage of the overall circuit. As is well known in the art, in current mirror 12, the current flowing through PNP transistor QM is mirrored in PNP transistors QA and QB. PNP transistors may be scaled in size relative to PNP transistor QM to scale the current.

Further, in accordance with the present invention, series resistors RA and RB in current mirror 12 respectively reduce the current flowing into the emitters of PNP transistors QA and QB when power in the overall circuit is disabled but a differential input signal is present at terminals 13 and 14. This reduced current under these conditions reduce the likelihood that the parasitic PNPN structure from the base of NPN transistor QC (and NPN transistor QD) to PNP transistor QA (and PNP transistor QB) will turn on, thereby reducing latch-up susceptibility.

Similarly, series resistors RC and RD respectively reduce the current flowing into the bases of NPN transistors QC and QD when power in the overall circuit is disabled but a differential input signal is present at terminals 13 and 14. This reduced current under these conditions reduce the likelihood that the parasitic PNPN structure from the base of NPN transistor QC (and NPN transistor QD) to PNP transistor QA (and PNP transistor QB) will turn on, thereby further reducing latch-up susceptibility. For one embodiment, the sizes for transistors and resistors used in differential input stage 10 are summarized in Table 1 below. The transistor values refer to the size of the transistor relative to the minimum transistor device size for the process.

TABLE 1

| QC, QD | 2X |
|---|---|
| RC, RD | 30 kΩ |
| QM, QA, QB | 1X |
| RLM, RLA, RLB | 10 kΩ |
| RM, RA, RB | 10 kΩ |

As will be appreciated by those skilled in the art after reviewing the present disclosure, the transistors and resistors can have other values, depending on the application, so long as the current into each of the PN junctions of the parasitic PNPN structures is reduced to about 100 $\mu$A or below.

Figure 2:
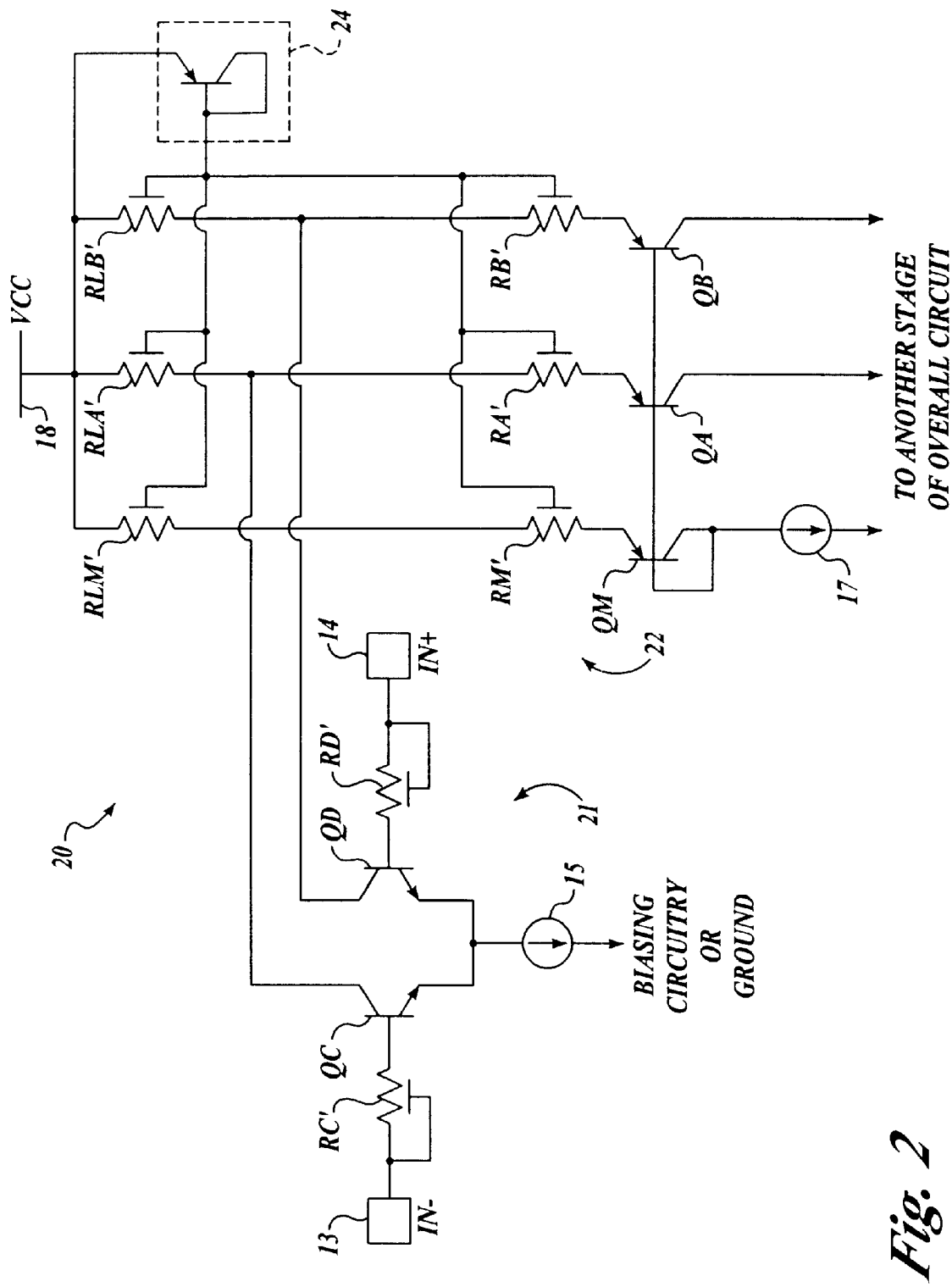
FIG. 2 is a schematic diagram illustrating a differential input stage, according to another embodiment of the present invention.

FIG. 2 schematically illustrates a differential input stage 20, according to another embodiment of the present invention. Differential input stage 20 is substantially similar to differential input stage 10 (FIG. 1), except that in differential input stage 20, the resistors are implemented using P-type wells in N-type tubs. VCC bus 18 is shorted to the N-type tubs through a diode to prevent current from flowing from the PN junction of the resistors to VCC bus 18. Differential input stage 20 is described in more detail below.

In this embodiment, differential input stage 20 includes an emitter-coupled pair stage 21 and a current mirror 22. Emitter-coupled pair stage 21 is substantially similar to emitter-coupled pair stage 11 (FIG. 1) except that emitter-coupled pair stage 21 includes series resistors RC' and RD' instead of series resistors RC and RD (FIG. 1). Series resistors RC' and RD' are resistors are implemented as P-type well resistors.

Current mirror 22 is substantially similar to current mirror 12 (FIG. 1) except that current mirror 22 includes series resistors RM', RA' and RB' instead of series resistors RM, RA and RB (FIG. 1), and load resistors RLM', RLA' and RLB' instead of load resistors RLM, RLA and RLB (FIG. 1). Series resistors RM', RA' and RB' and load resistors RLM', RLA' and RLB' are also resistors implemented as P-type well resistors. In this embodiment, current mirror 22 also includes a diode 24 that is connected between VCC line 18 and the P-type wells of the resistors in current mirror 22 so that the P-type well will be a threshold voltage below the voltage at VCC bus 18. As mentioned above, this diode configuration helps ensure that current cannot flow through the PN junction of the resistors to VCC bus 18.

As in differential input stage 10 (FIG. 1), the series resistors (i.e., resistors RA' and RB' and RC' and RD') reduce the current flowing into PN junctions of the parasitic PNPN structures, thereby reducing latch-up susceptibility when power to the overall circuit is disabled.

Figure 3:
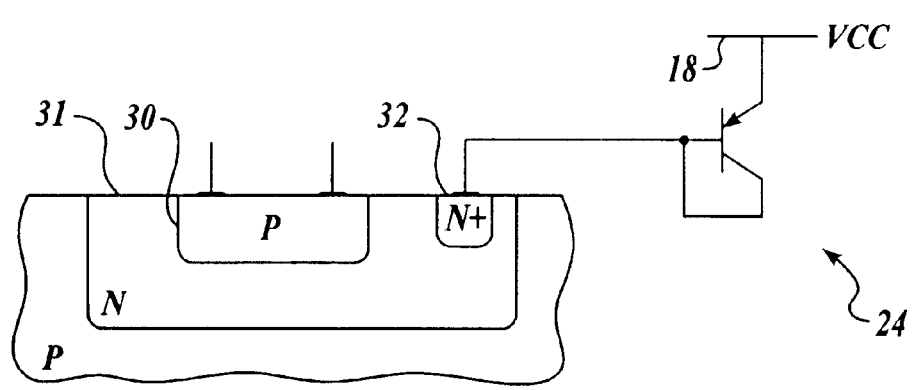
FIG. 3 is a cross-sectional diagram illustrating reverse biasing of P-type well resistors, according to one embodiment of the present invention.

FIG. 3 illustrates how diode 24 is connected to the P-type well resistors of differential input stage 20. In particular, the well resistor is formed in a P-type well 30, which in turn is formed in a N-type tub 31. N-type tub 31 is connected to diode 24 through a contact 32.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A circuit comprising:
    a pair of input terminals;
    a first pair of resistors electrically connected to the pair of input terminals;
    a first pair of bipolar transistors with their emitters being electrically connected, wherein the bases of the first pair of bipolar transistors are electrically connected to the first pair of resistors;
    a second pair of resistors electrically connected to collectors of the first pair of bipolar transistors; and
    a current mirror having a second pair of bipolar transistors, wherein the emitters of the second pair of bipolar transistors are coupled to the collectors of the first pair of bipolar transistors through the second pair of resistors such that susceptibility to latch-up is minimized by the arrangement of the first and second pair of resistors.

2. The circuit of claim 1 wherein the second pair of resistors are implemented using a P-type well.

3. The circuit of claim 2, further comprising a diode connected to a power bus and a second pair of resistors, wherein the diode is configured to prevent current from flowing from the second pair of resistors to the power bus.

4. The circuit of claim 1 wherein the first pair of bipolar transistors are NPN transistors.

5. The circuit of claim 1 wherein the second pair of bipolar transistors are PNP transistors.

6. The circuit of claim 1 wherein the circuit is a differential input stage.

7. A circuit comprising:
    a pair of input terminals;
    a first means electrically connected to the pair of input terminals, for providing impedance;
    a first pair of bipolar transistors with their emitters being electrically connected, wherein the bases of the first pair of bipolar transistors are electrically connected to the first means;
    second means, electrically connected to collectors of the first pair of bipolar transistors, for providing impedance; and a current mirror having a second pair of bipolar transistors, wherein the emitters of the second pair of bipolar transistors are coupled to the collectors of the first pair of bipolar transistors through the second means for providing impedance such that susceptibility to latch-up is minimized by the arrangement of the first and second means for providing impedance.

8. The circuit of claim 7 wherein the second pair of bipolar transistors are PNP transistors.

9. The circuit of claim 7 wherein the circuit is a differential input stage.

10. The circuit of claim 7 wherein the second means is implemented using a P-type well.

11. The circuit of claim 10, further comprising a diode connected to a power bus and the second means, wherein the diode is configured to prevent current from flowing from the P-type well to the power bus.

12. The circuit of claim 7 wherein the first pair of bipolar transistors are NPN transistors.

13. A circuit comprising:
 a pair of input terminals;
 a first pair of resistors that is coupled to the pair of input terminals;
 a first pair of bipolar transistors with their emitters being coupled, wherein the bases of the first pair of bipolar transistors are coupled to the first pair of resistors;
 a second pair of resistors that are coupled to the collectors of the first pair of bipolar transistors; and
 a current mirror that includes a second pair of bipolar transistors with their emitters being coupled to the collectors of the first pair of bipolar transistors through the second pair of resistors, wherein the first and second pair of resistors are arranged to minimize the impact of parasitic PNPN structures, formed between the first pair of transistors and the second pair of transistors, such that susceptibility to latch-up is minimized.

14. A differential input stage that is configured to minimize latch-up susceptibility, comprising:
 a first bipolar transistor;
 a second bipolar that has an emitter coupled to the emitter of the first bipolar transistor;
 a first resistor that is coupled to the base of the first bipolar transistor;
 a second resistor that is coupled to the base of the second bipolar transistor;
 a third resistor that is coupled to the collector of the first bipolar transistor;
 a fourth resistor that is coupled to the collector of the second bipolar transistor;
 a third bipolar transistor that has an emitter that is coupled to the collector of the first bipolar transistor through the third resistor; and
 a fourth bipolar transistor that has an emitter that is coupled to the collector of the second bipolar transistor through the fourth resistor, wherein the first, second, third, and fourth resistors are arranged to minimize the impact of parasitic PNPN structures in the circuit such that susceptibility to latch-up is minimized.

15. The circuit of claim 14 wherein the third bipolar transistor and fourth bipolar transistor are implemented using a P-type well.

16. The circuit of claim 14 further comprising a diode that is coupled to a power bus, wherein the power bus is coupled to the third resistor and the fourth resistor through the diode, wherein the diode is configured to prevent current from flowing from third resistor and fourth resistor to the power bus.

* * * * *